United States Patent [19]

Yamasaki

[11] Patent Number: 5,523,708
[45] Date of Patent: Jun. 4, 1996

[54] APPARATUS FOR MONITORING ABNORMALITY OF EACH CLOCK DRIVER INPUT AND OUTPUT SIGNAL IN A CIRCUIT COMPRISING A PLURALITY OF CLOCK DRIVERS

[75] Inventor: Hiroshi Yamasaki, Kawasaki, Japan

[73] Assignee: Fujitsu Limited, Kanagawa, Japan

[21] Appl. No.: 187,098

[22] Filed: Jan. 25, 1994

[30] Foreign Application Priority Data

Sep. 14, 1993 [JP] Japan ................... 5-228796

[51] Int. Cl.⁶ .................................................. G01R 29/027
[52] U.S. Cl. ................... 327/20; 327/7; 340/657; 340/658; 331/46
[58] Field of Search ................... 327/20, 18, 7, 327/45, 41, 49, 3, 22, 23, 159; 371/24; 331/46, 47, 49, 55; 340/657, 658, 660, 661, 662, 663, 659, 652

[56] References Cited

U.S. PATENT DOCUMENTS

| | | | |
|---|---|---|---|
| 4,362,957 | 12/1982 | Stern | 327/18 |
| 4,473,805 | 9/1984 | Guhn | 327/41 |
| 4,583,013 | 4/1986 | Gupta | 327/18 |
| 4,628,253 | 12/1986 | Yu et al. | 327/20 |
| 4,638,246 | 1/1987 | Blank et al. | 371/24 |
| 5,036,230 | 7/1991 | Bazes | 307/527 |
| 5,229,752 | 7/1993 | Gliebe et al. | 340/658 |
| 5,287,010 | 2/1994 | Hagiwara | 327/18 |
| 5,381,085 | 1/1995 | Fischer | 327/159 |
| 5,416,443 | 5/1995 | Cranford, Jr. et al. | 331/49 |

FOREIGN PATENT DOCUMENTS

| | | |
|---|---|---|
| 0282735 | 9/1988 | European Pat. Off. . |
| 0359177 | 3/1990 | European Pat. Off. . |
| 8800733 | 1/1988 | WIPO . |

*Primary Examiner*—Timothy P. Callahan
*Assistant Examiner*—Terry L. Englund

[57] ABSTRACT

A method of monitoring abnormality of a clock driver in an electronic apparatus having a clock supply unit that supplies a clock signal and a plurality of function executing units to which the clock signal is inputted for executing prescribed functions at an identical clock, wherein each function executing unit is provided with a clock driver which, on the basis of the clock signal, oscillates internally to reproduce a clock signal, includes monitoring cut-off of an input clock signal and cut-off of an output clock signal of the clock driver, and outputting an alarm upon judging that the clock driver is abnormal in a case where the output clock signal has been cut off but the input clock signal has not. Alternatively, the method includes monitoring the phase of the input clock signal and the phase of the output clock signal of the clock driver, and outputting an alarm upon judging that the clock driver is abnormal in a case where the output clock signal has developed a phase shift, which is greater than a prescribed value, with respect to the input clock signal.

1 Claim, 9 Drawing Sheets

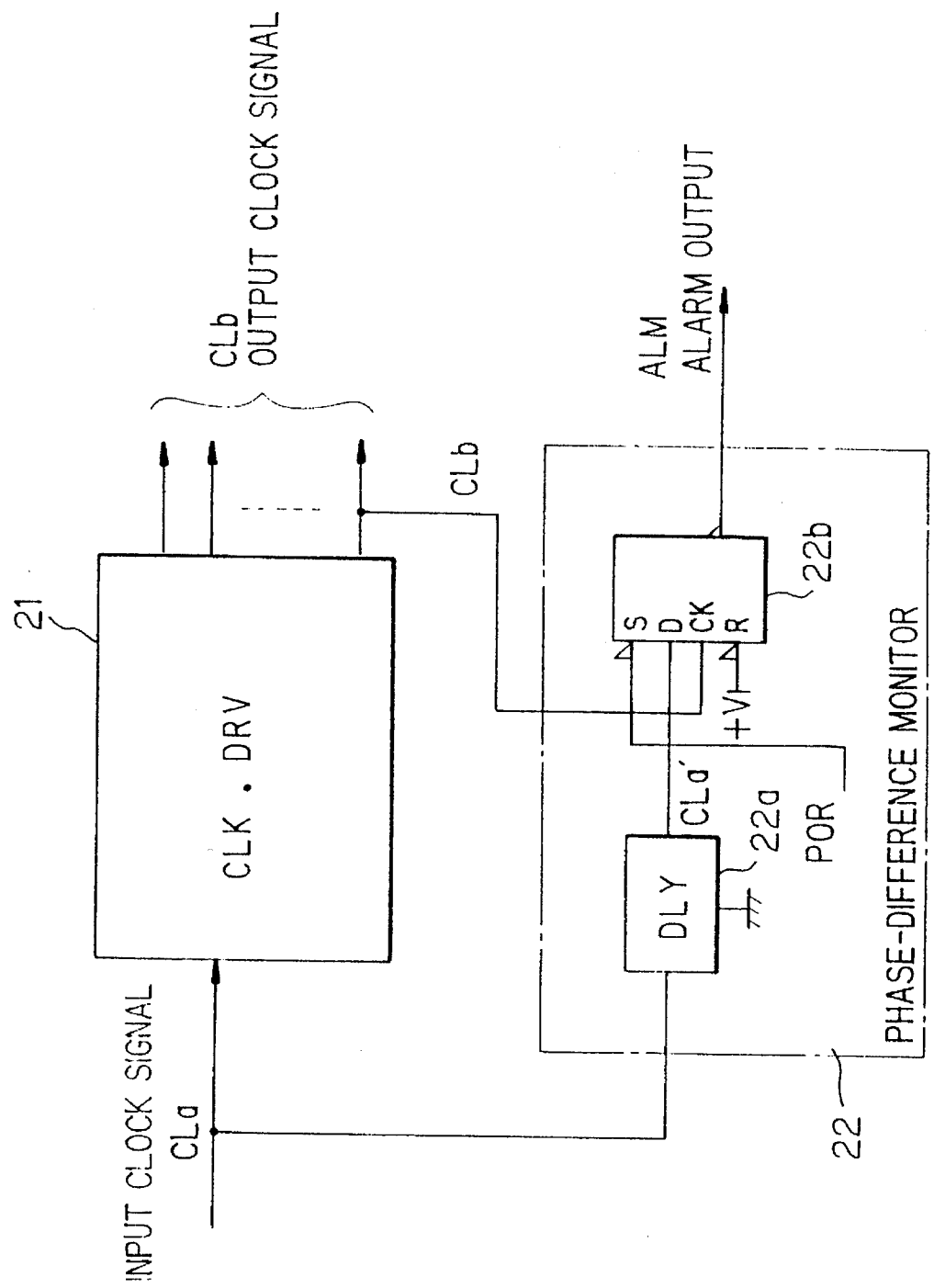

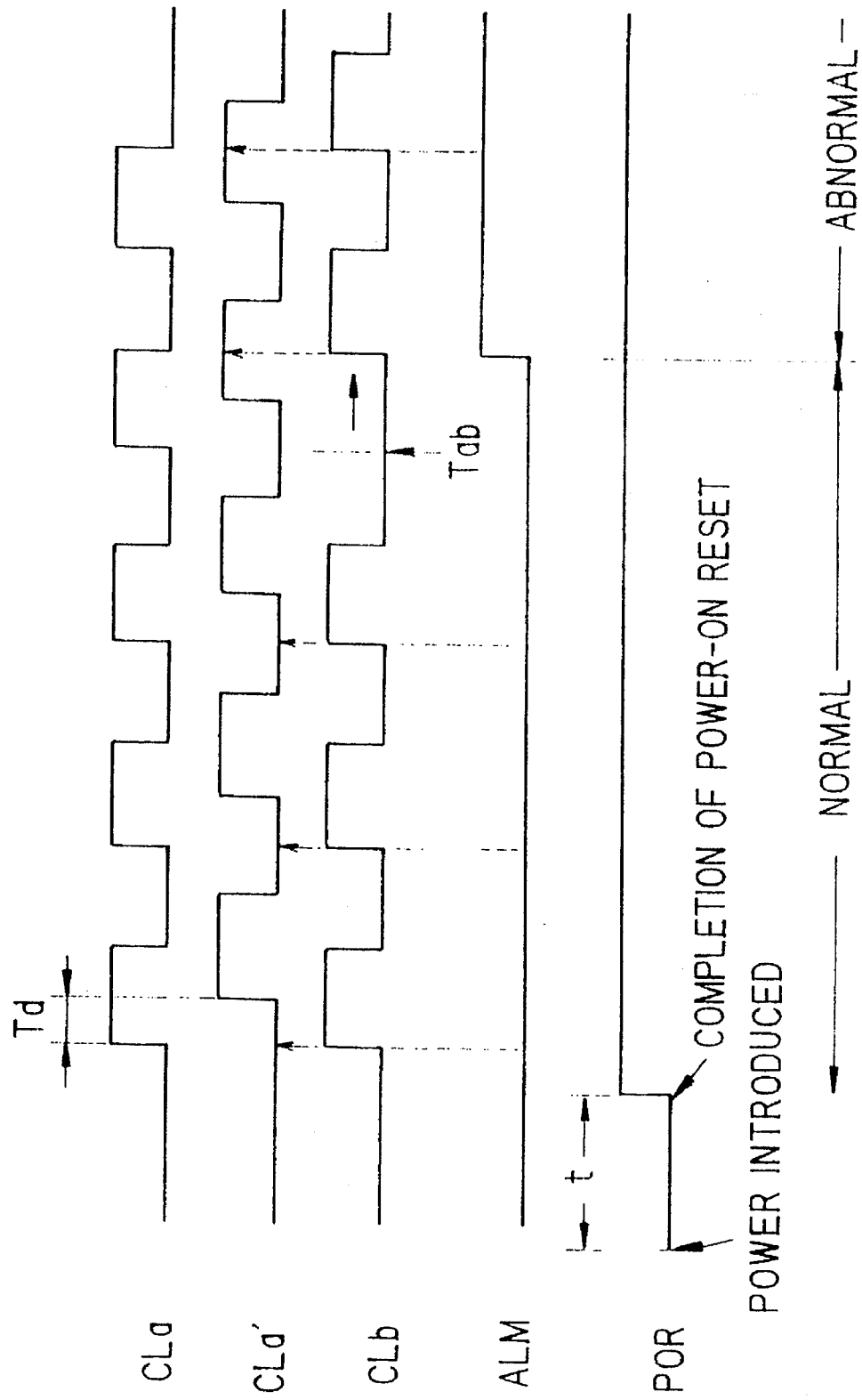

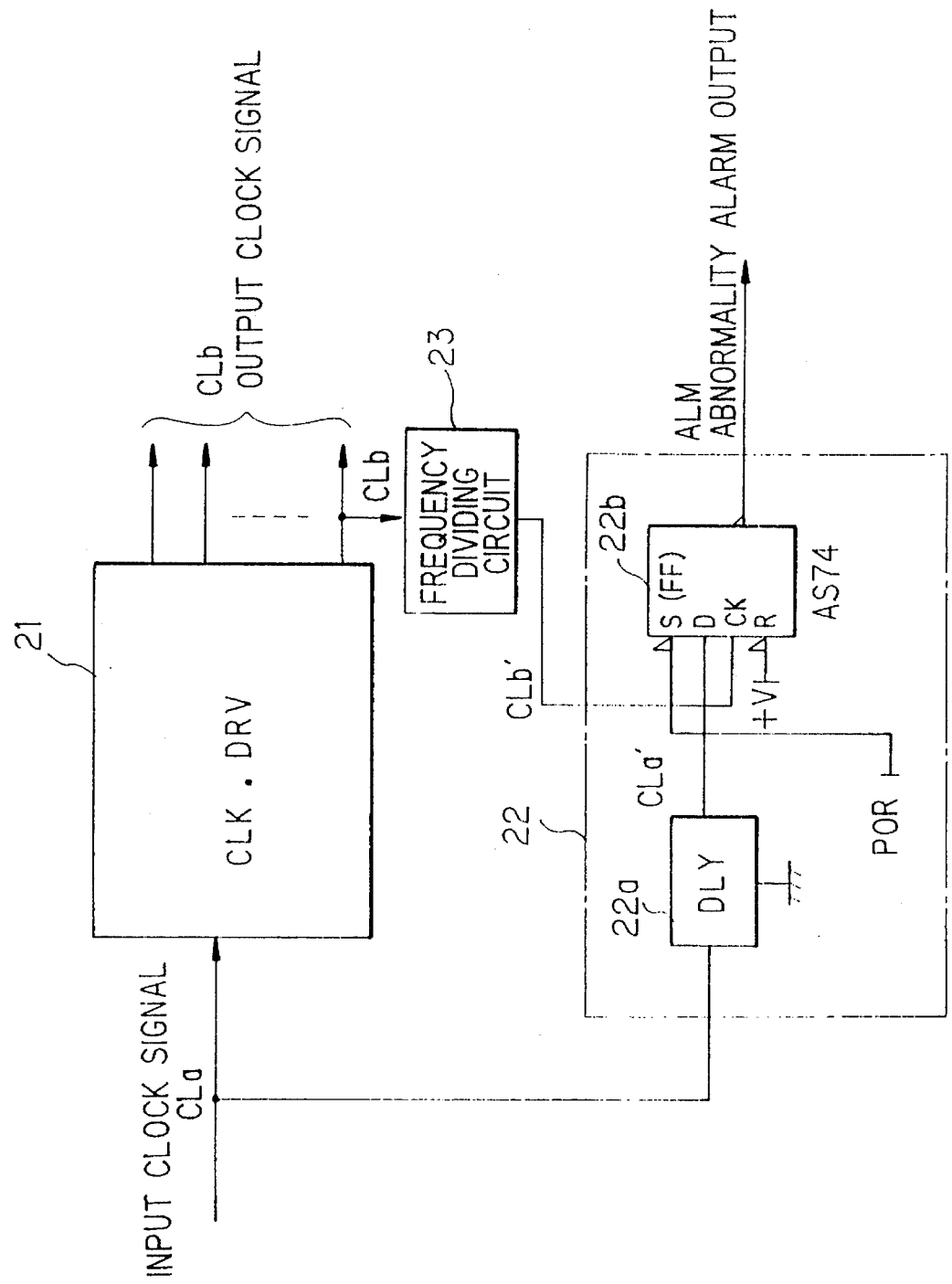

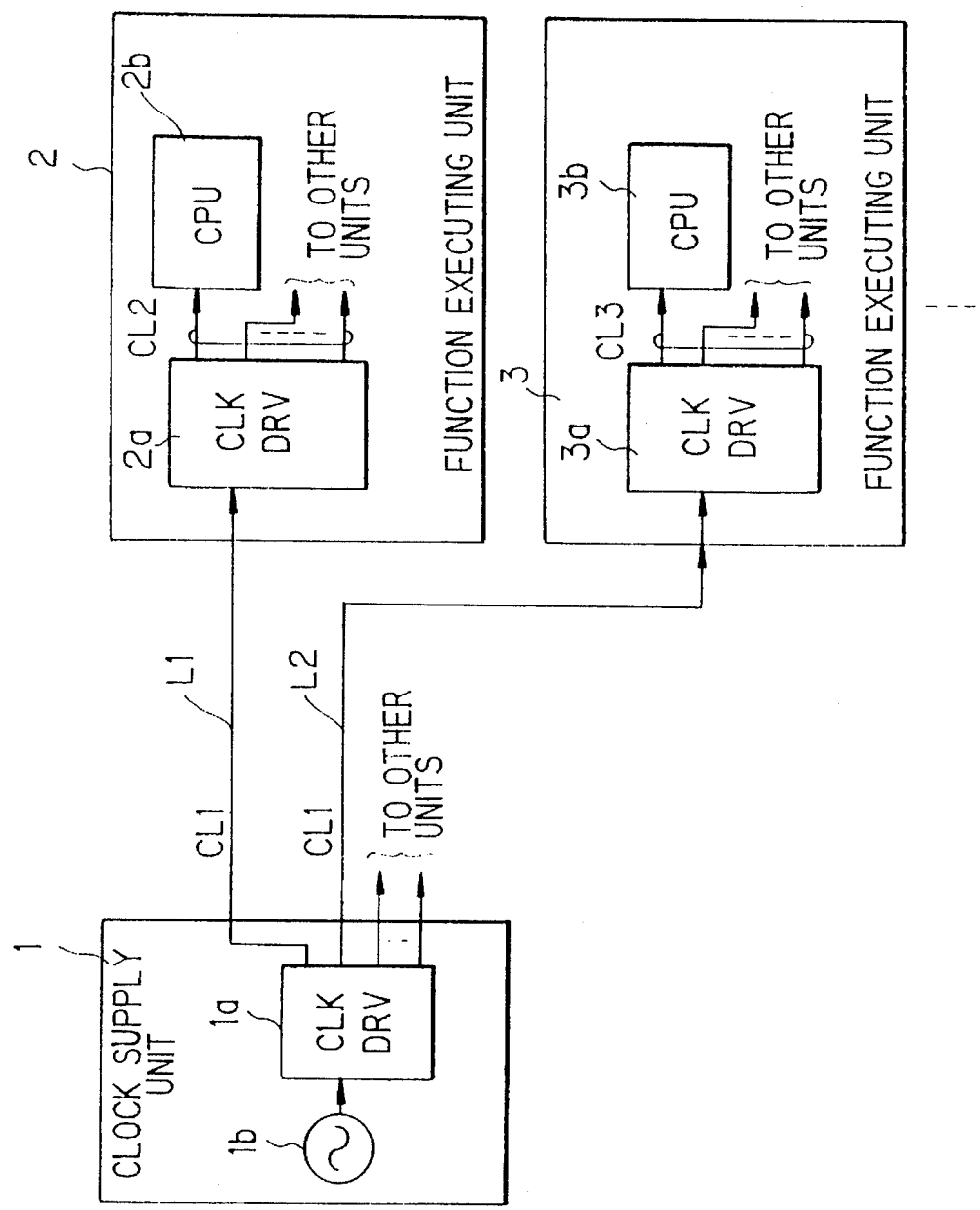

ic apparatus. More particularly, the invention relates to a method and apparatus for monitoring abnormality in the clock driver of an electronic apparatus having a clock supply unit that supplies a clock signal and a plurality of function executing units to which the clock signal is applied for executing prescribed functions at an identical clock, wherein each function executing unit is provided with a clock driver which, on the basis of the clock signal, oscillates internally to reproduce a clock signal.

APPARATUS FOR MONITORING ABNORMALITY OF EACH CLOCK DRIVER INPUT AND OUTPUT SIGNAL IN A CIRCUIT COMPRISING A PLURALITY OF CLOCK DRIVERS

BACKGROUND OF THE INVENTION

This invention relates to a method and apparatus for monitoring abnormality in the clock driver of an electronic apparatus. More particularly, the invention relates to a method and apparatus for monitoring abnormality in the clock driver of an electronic apparatus having a clock supply unit that supplies a clock signal and a plurality of function executing units to which the clock signal is applied for executing prescribed functions at an identical clock, wherein each function executing unit is provided with a clock driver which, on the basis of the clock signal, oscillates internally to reproduce a clock signal.

In an electronic-information-communication apparatus (hereinafter referred to simply as an "electronic apparatus") using a plurality of CPUs or an electronic apparatus in which it is required that a plurality of units be operated by a common clock, an important problem that has recently arisen is speeding up the operating clock in order to satisfy the need for higher processing speeds of the CPUs or individual units.

Though it is necessary to raise the speed of the clock in each unit (inclusive of CPUs), simply raising clock speed can cause the clock to undergo skewing (a phase shift) or jitter, depending upon the connection distance between units. This can lead to erroneous operation of the apparatus or have a highly deleterious effect upon the operation of the apparatus.

In order to solve this problem, the practice in the prior art is to mount a clock driver on each clock sending/receiving unit. A clock between units is produced by internal oscillation of the clock driver. Alternatively, a low-speed clock is transmitted between units and the necessary high-speed clock is reproduced by internal oscillation of the clock driver.

FIG. 9 is a block diagram illustrating a conventional electronic apparatus of this kind. Numeral 1 denotes a clock supply unit for supplying a clock signal, and numerals 2, 3 represent a plurality of function executing units for executing prescribed functions at an identical clock. These units have clock drivers (CLK DRV) 1a, 2a, 3a, . . . , respectively, each of which is constituted by a PLL circuit (phase-locked loop circuit), by way of example.

The clock supply unit 1 includes a standard-frequency oscillator 1b that produces a signal on the basis of which the clock driver 1a generates a clock signal CL1 transmitted to the function executing units 2, 3, . . . via lines L1, L2, . . . , respectively.

The function executing units 2, 3, . . . receive the clock signal CL1 and generate, by internal oscillation, clocks CL2, CL3, . . . , respectively, used within the respective units. The clocks CL2, CL3, . . . are supplied to the CPUs, 2b, 3b, . . . and other circuit within the respective units. The units execute prescribed functions on the basis of the clock signals CL2, CL3.

In accordance with this arrangement, the effects of skewing and jitter can be eliminated by slowing down the frequency of the clock signal CL1 supplied by the clock supply unit 1, and generating the high-speed clock signals CL2, CL3, . . . on the side of the function execution units based upon the low-speed clock signal CL1.

In this arrangement in which each unit is provided with a clock driver, a malfunction in the clock driver of any unit can result in the clock not being outputted or in output of a clock having a fluctuating phase. When this occurs, the CPU or circuitry using this clock will operate erroneously. In the prior art, therefore, unit failure is detected by monitoring the operation of the CPU or circuitry.

Recent years have seen greater demand for an improvement in apparatus reliability and for shorter recovery time. Thus there is need for a function through which it is possible to judge which part in a unit is malfunctioning, as well as a function through which a changeover is made to a separately provided spare clock driver when the other clock driver fails.

SUMMARY OF THE INVENTION

Accordingly, an object of the present invention is to provide an abnormality monitoring method and apparatus whereby an abnormality in a clock driver is capable of being detected.

Another object of the present invention is to provide an abnormality monitoring method and apparatus through which is possible to detect loss of output or occurrence of a phase shift in a clock driver.

In order to attain the foregoing objects, the present invention provides a first method of monitoring abnormality of a clock driver comprising a step of monitoring cut-off of an input clock signal and cut-off of an output clock signal of the clock driver, and a step of judging that the clock driver is abnormal in a case where the output clock signal has been cut off but the input clock signal has not.

Further, in order to attain the foregoing objects, the present invention provides a second method of monitoring abnormality of a clock driver comprising a step of monitoring phase of an input clock signal and phase of an output clock signal of the clock driver, and a step of judging that the clock driver is abnormal in a case where the output clock signal has developed a phase shift, in excess of a prescribed value, with respect to the input clock signal.

Furthermore, in order to attain the foregoing objects, the present invention provides a first apparatus for monitoring abnormality of a clock driver, comprising first and second clock-signal cut-off detectors for detecting cut-off of an input clock signal and cut-off of an output clock signal, respectively, of the clock driver, and an abnormality discriminating unit for outputting an alarm signal, which is indicative of an abnormality in the clock driver, in a case where the output clock signal has been cut off but the input clock signal has not.

Furthermore, in order to attain the foregoing objects, the present invention provides a second apparatus for monitoring abnormality of a clock driver, comprising a phase-difference monitoring unit for comparing a phase difference between an input clock signal and an output clock signal of the clock driver with a prescribed value and outputting an alarm signal, which is indicative of an abnormality in the clock driver, when a phase difference greater than the prescribed value has been detected.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 5 is a circuit diagram illustrating a second embodiment of the present invention;

FIG. 6 is a waveform diagram for describing the operation of the invention;

FIG. 7 is a circuit diagram illustrating a third embodiment of the present invention;

FIG. 9 is a block diagram illustrating a conventional electronic apparatus.

DESCRIPTION OF THE PREFERRED EMBODIMENTS (a) General Features of the Invention FIGS. 1A and 1B are block diagrams for describing the general features of aspects of the present invention. Shown in FIG. 1A are a clock driver 11, first and second clock-signal cut-off detectors 12, 13 for detecting cut-off of an input clock signal CLa and output clock signal CLb of the clock driver 11, and an abnormality discriminating unit 14 for outputting an alarm signal, which indicates that the clock driver 11 is abnormal, in a case where the output clock signal CLb is cut off but not the input clock signal CLa. Shown in FIG. 1B are a clock driver 21, and a phase-difference monitoring unit 22 for comparing a phase difference between the input clock signal CLa and the output clock signal CLb of the clock driver 21, and outputting an alarm signal, which indicates that the clock driver 21 is abnormal, in a case where a phase difference greater than a prescribed value has been detected.

Figure 1A:
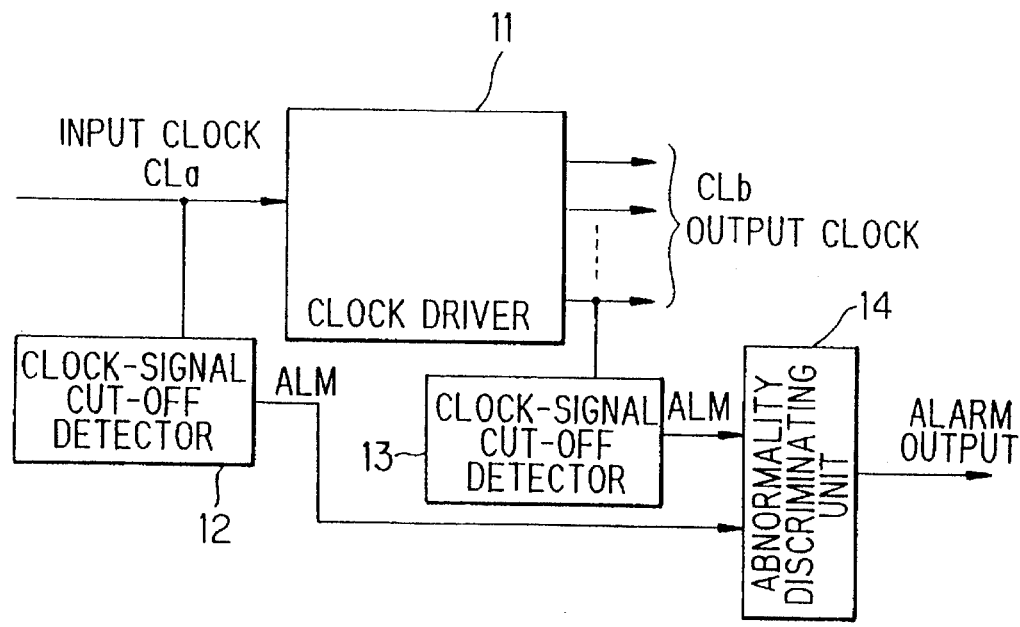
FIG. 1A is a block diagram for describing the general features of a first aspect of the present invention.

According to a first method of the invention, the first and second clock-signal cut-off detectors 12, 13, respectively, monitors cut-off of the input clock signal CLa and cut-off of the output clock signal CLb of the clock driver 11 and an abnormality discriminating unit 14 outputs an alarm upon judging that the clock driver 11 is abnormal in a case where the output clock signal CLb has been cut off but the input clock signal CLa has not. (See FIG. 1A above in regard to the first method.)

Figure 1B:
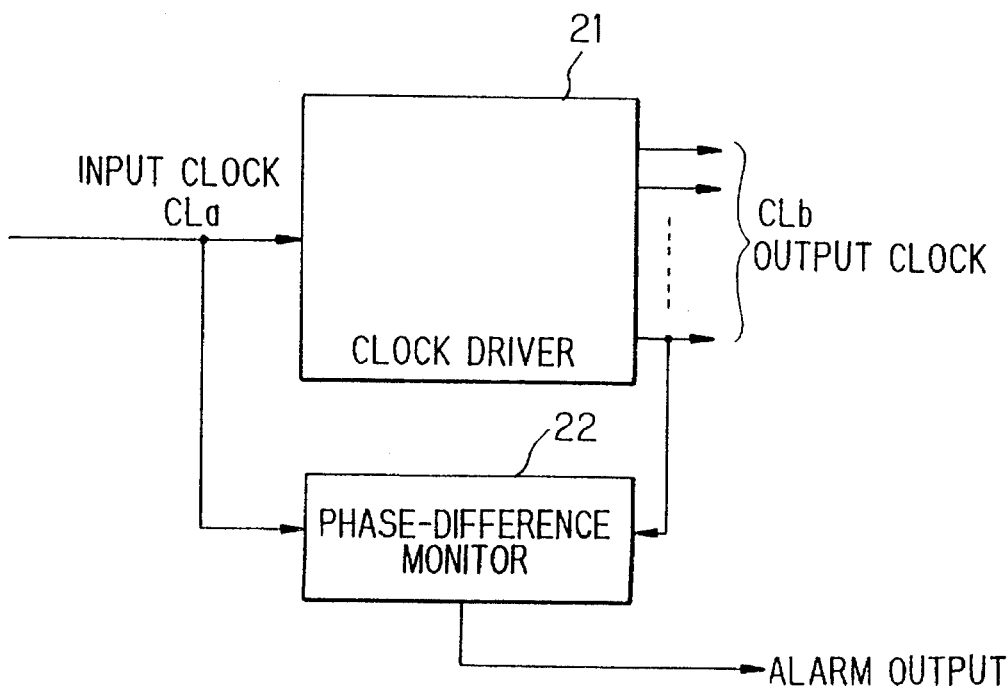
FIG. 1B is a block diagram for describing the general features of a second aspect of the present invention.

According to a second method of the invention, the phase-difference monitoring unit 22 monitors the phase of the input clock signal CLa and the phase of an output clock signal CLb of the clock driver 21 and outputs an alarm upon judging that the clock driver 21 is abnormal in a case where the output clock signal CLb has developed a phase shift, in excess of a prescribed value, with respect to the input clock signal CLa. (See FIG. 1B above in regard to the second method.)

A third method of the invention includes monitoring cut-off of the input clock signal and cut-off of the output clock signal of the clock driver, monitoring the phase of the input clock signal and the phase of an output clock signal of the clock driver, judging that the clock driver is abnormal when the output clock signal has been cut off but the input clock signal has not, and judging that the clock driver is abnormal when the output clock signal has developed a phase shift, in excess of a prescribed value, with respect to the input clock signal.

(b) First Embodiment of the Invention

Figure 2:
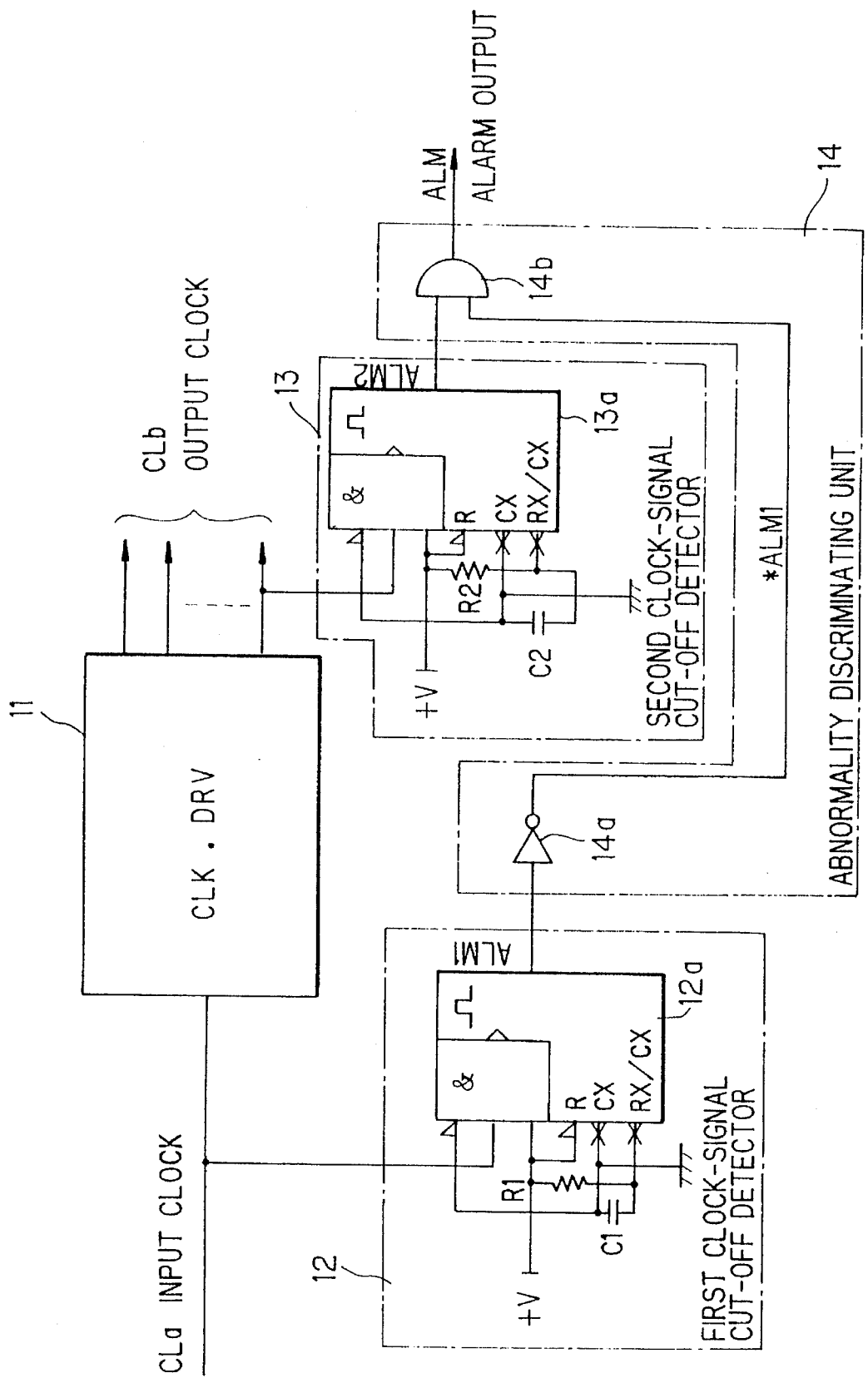
FIG. 2 is a circuit diagram illustrating a first embodiment of the present invention.

FIG. 2 is a circuit diagram illustrating a first embodiment of the present invention for detecting abnormality in a clock driver. Numeral 11 denotes the clock driver, 12 the first clock-signal cut-off detector for detecting cut-off of the input clock signal CLa of the clock driver 11, 13 the second clock-signal cut-off detector for detecting cut-off of the output clock signal CLb of the clock driver 11, and 14 the abnormality discriminating unit for outputting an alarm signal, which indicates that the clock driver 11 is abnormal, in a case where the output clock signal CLb is cut off but not the input clock signal CLa.

Figure 3:
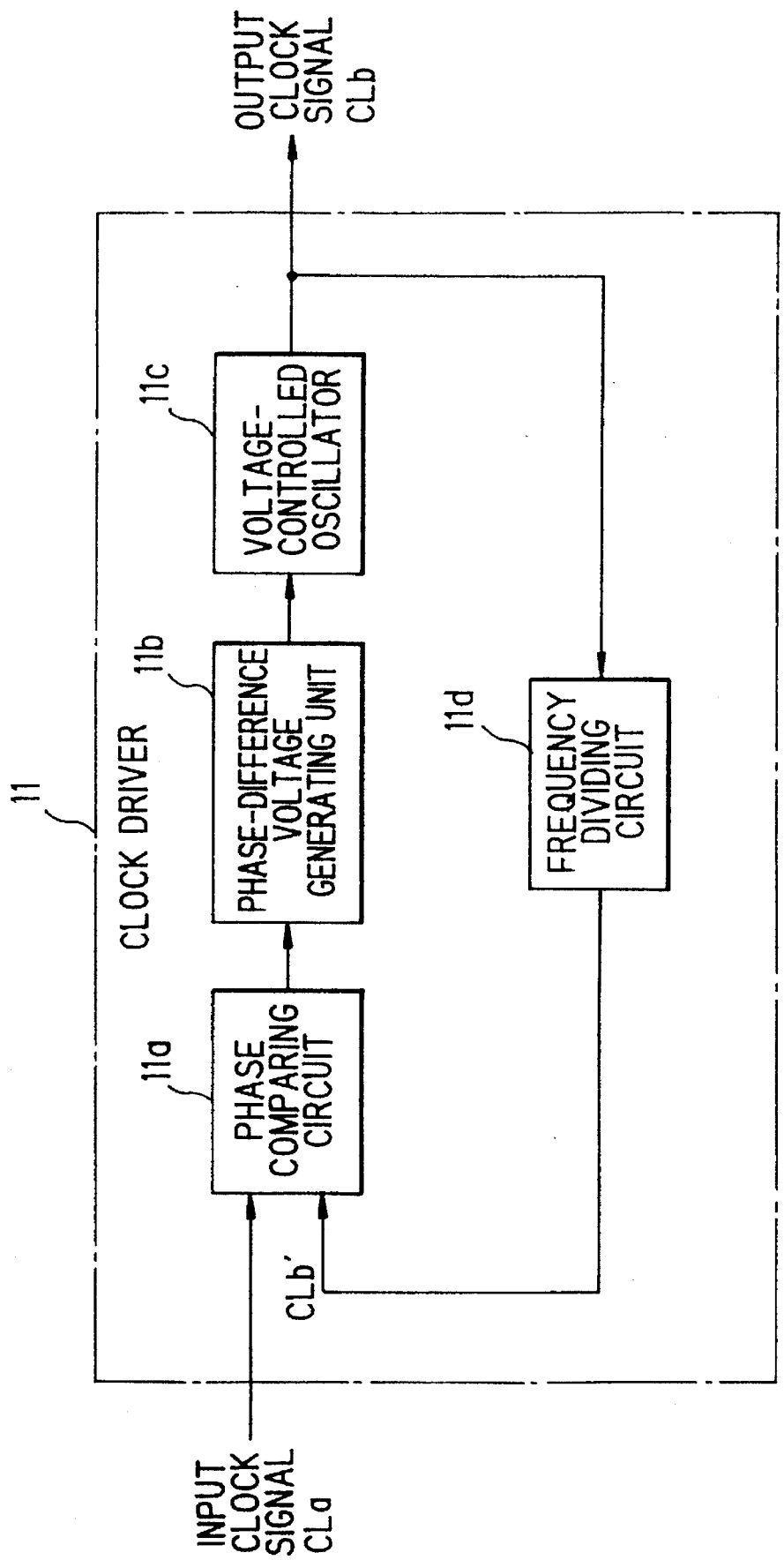
FIG. 3 is a block diagram illustrating a known clock driver, shown as a Phase Lock Loop (PLL)

The clock driver 11 is constituted by a PLL circuit, by way of example. As shown in FIG. 3, the clock driver 11 includes a phase comparator 11a for outputting the phase difference between the input clock signal CLa and a signal CLb' obtained by frequency-dividing the output clock signal CLb, a phase-difference voltage generating unit 11b such as a low-pass filter for generating a voltage commensurate with the phase difference, a voltage controlled oscillator (VCO) 11c, to which the voltage commensurate with the phase difference is applied as an input, for outputting the signal (the output clock signal) CLb, the frequency of which conforms to the input voltage, and a frequency dividing circuit 11d for frequency-dividing the output clock signal.

Figure 4A:
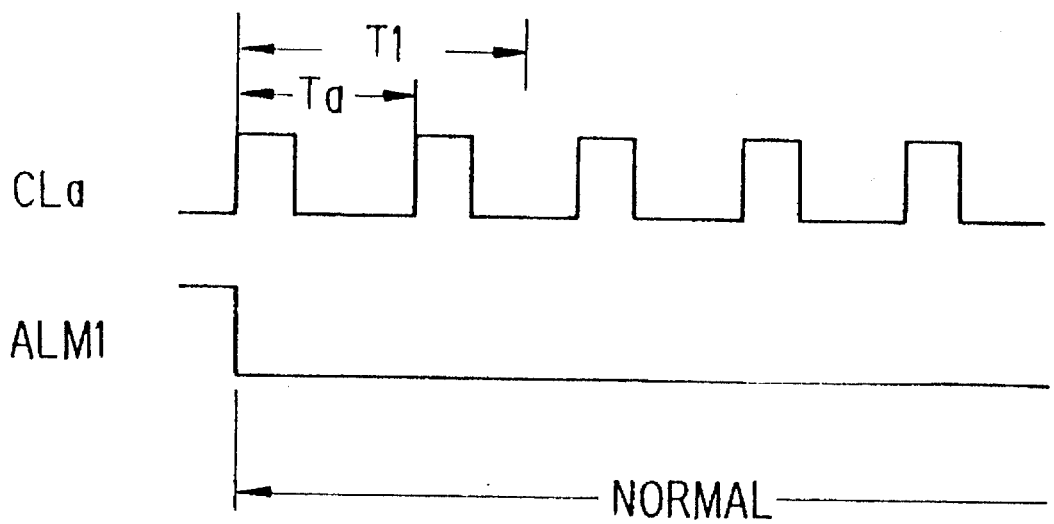
FIG. 4A and FIG. 4B are waveform diagrams for describing the operation of a signal cut-off detector.
Figure 4B:
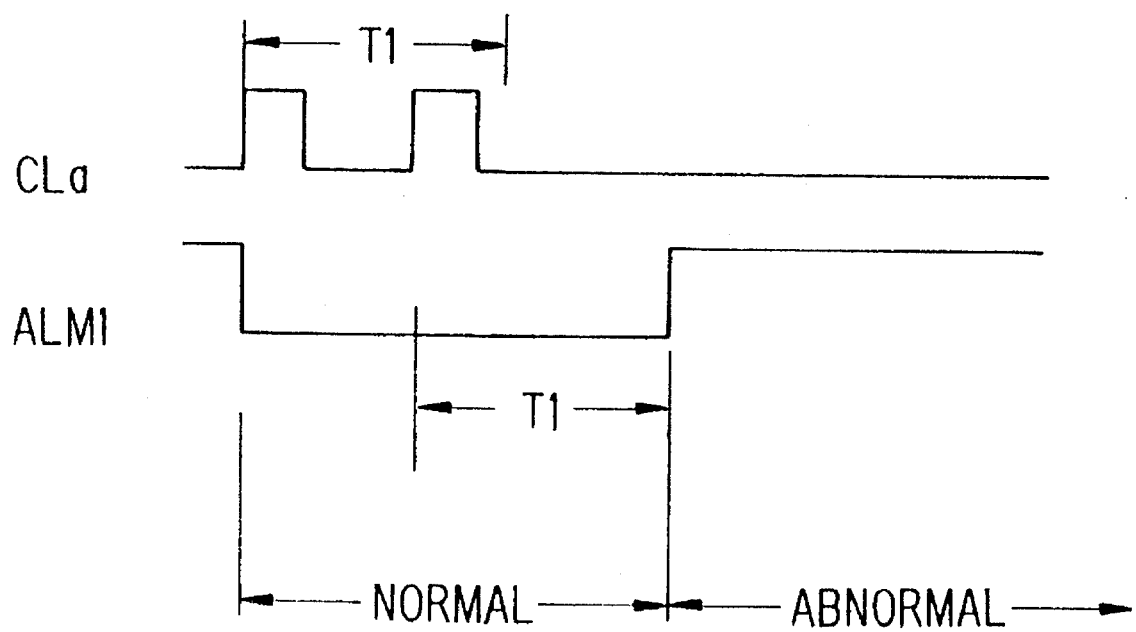

The first clock-signal cut-off detector 12 comprises a monostable multivibrator (74HC123 manufactured by National Semiconductor or Motorola, by way of example) 12a, and a resistor R1 and capacitor C1 for setting cut-off detection time. When an input is applied to the monostable multivibrator 12a, the latter outputs a pulse whose duration (the duration of the low level) is decided by C1·R1 (=T1). Accordingly, as illustrated in FIG. 4A, by setting C1·R1 (=T1) to be longer than the period Ta of the input clock signal CLa, the output (alarm signal) ALM1 of the multivibrator can be made a low-level signal at all times in a case where the input clock signal CLa is entering normally. However, when the input clock signal CLa is cut off, as shown in FIG. 4B, the alarm signal ALM1 is raised to the high level after a period of time T1 following the leading edge of the last input clock signal CLa.

The second clock-signal cut-off detector 13 comprises a monostable multivibrator (74HC123 manufactured by National Semiconductor or Motorola, by way of example) 13a, and a resistor R2 and capacitor C2 for setting cut-off detection time. When an input is applied to the monostable multivibrator 13a, the latter outputs a pulse (an alarm signal ALM2) whose duration (the duration of the low level) is decided by C2·R2 (=T2). Operation is exactly the same as that of the first clock-signal cut-off detector 12.

The abnormality discriminating unit 14 has an inverting gate (NOT gate) 14a for inverting the level of the alarm signal ALM1, and an AND gate 14b for taking the logical product between the inverted signal *ALM1 and the alarm signal ALM2, which is outputted by the second clock-signal cut-off detector 13.

In a case where the input clock signal CLa is entering and the clock driver 11 is delivering the output clock signal CLb normally, the alarm signals ALM1, ALM2 are both at the low level and, hence, the abnormality discriminating unit 14 does not output an alarm signal indicative of an abnormality. In a case where the input clock signal CLa is not entering, the output clock signal CLb is not delivered. However, since the alarm signals ALM1, AML2 are both at the high level, the abnormality discriminating unit 14 is not outputted.

If an abnormality develops in the clock driver 11 so that the output clock signal CLb is not delivered in a case where the input clock signal CLa is entering, the alarm signal ALM1 assumes the low level and the alarm signal ALM2 rises to the high level. As a result, the output of the AND gate 14b attains the high level and the abnormality discriminating unit 14 outputs the abnormality alarm signal ALM (="1").

(c) Second Embodiment of the Invention

FIG. 5 is a circuit diagram illustrating a second embodiment of the present invention. Numeral 21 denotes the clock driver. By adopting a PLL circuit as the clock driver 21, the phase difference between the input/output clocks CLa, CLb is suppressed and made a small value. Numeral 22 denotes the phase-difference monitoring unit for comparing the phase difference between the input clock signal CLa and the output clock signal CLb of the clock driver, and outputting an abnormality alarm signal ALM, which indicates that the clock driver is abnormal, in a case where a phase difference greater than a prescribed value has been detected.

The phase-difference monitoring unit 22 has a delay circuit (DLY) 22a for delaying the input clock signal CLa by a prescribed period of time, thereby outputting a delayed clock signal CLa' and a flip-flop (74AS74, etc.) 22b.

A power-on reset signal POR, which assumes the low level a prescribed period of time after power is introduced, is applied to the set terminal of the flip-flop 22b so that the abnormality alarm signal ALM will not be outputted when power is introduced. The delayed clock signal CLa' enters the D terminal of the flip-flop 22b, and the output clock signal CLb enters the clock terminal of the flip-flop 22b.

When the clock driver 21 is operating normally, the flip-flop 22b does not latch the input clock signal CLa (i.e., does not output the abnormality alarm signal ALM) at the timing of the leading edge of the output clock signal CLb. When the clock driver 21 is operating abnormally, the flip-flop 22b latches the input clock signal CLa and outputs the abnormality alarm signal ALM at the timing of the leading edge of the output clock signal CLb.

When power is introduced to the electronic apparatus, the low-level power-on reset signal POR (see FIG. 6) is generated for a prescribed period of time t, the flip-flop 22b of the phase-difference monitoring unit 22 is reset and the abnormality alarm signal ALM is initially set to the low level.

When the input clock signal CLa subsequently enters, this signal is delayed for a prescribed period of time Td by the delay circuit 22a before entering the flip-flop 22b. If the clock driver 21 is operating normally and the output clock signal CLb is being generated at a frequency and phase identical with those of the input clock signal CLa, then the delayed input clock signal CLa' cannot be latched at the timing of the leading edge of the output clock signal CLb and the abnormality alarm signal ALM will be at the low level.

If the clock driver 21 develops an abnormality and the phase of the output clock signal CLb shifts at a time Tab (see FIG. 6) under these conditions, then the delayed input clock signal CLa' will attain the high level at the leading edge of the output clock signal CLb, the flip-flop 22b will be set and the high-level abnormality alarm signal ALM will be outputted.

(d) Third Embodiment of the Invention

In the second embodiment shown in FIG. 5, the clock driver 21 outputs the clock signal CLb having a frequency and phase identical with those of the input clock signal CLa. However, there are cases in which the clock signal CLb outputted by the clock driver 21 has a frequency N times that of the input clock signal.

In such cases, a frequency dividing circuit 23 for frequency-dividing the output clock signal CLb by N is provided, as shown in FIG. 7, and a frequency-divided clock signal CLb' outputted by the frequency dividing circuit 23 is applied to the clock terminal of the flip-flop 22b.

(e) Fourth Embodiment of the Invention

In the first embodiment, a failure that results in complete cut-off of the output from the clock driver can be detected but a failure that results in a phase shift or loss of synchronization in the PLL cannot. In the second and third embodiments, on the other hand, there are cases in which, depending upon the arrangement of the phase-difference monitoring unit, the abnormality alarm signal cannot be outputted owing to an impediment in the alarm-signal output function itself when the output of the clock driver is cut off completely. Accordingly, if the first and second embodiments are combined, cut-off of the output clock signal, a phase shift and loss of synchronization can all be detected.

Figure 8:
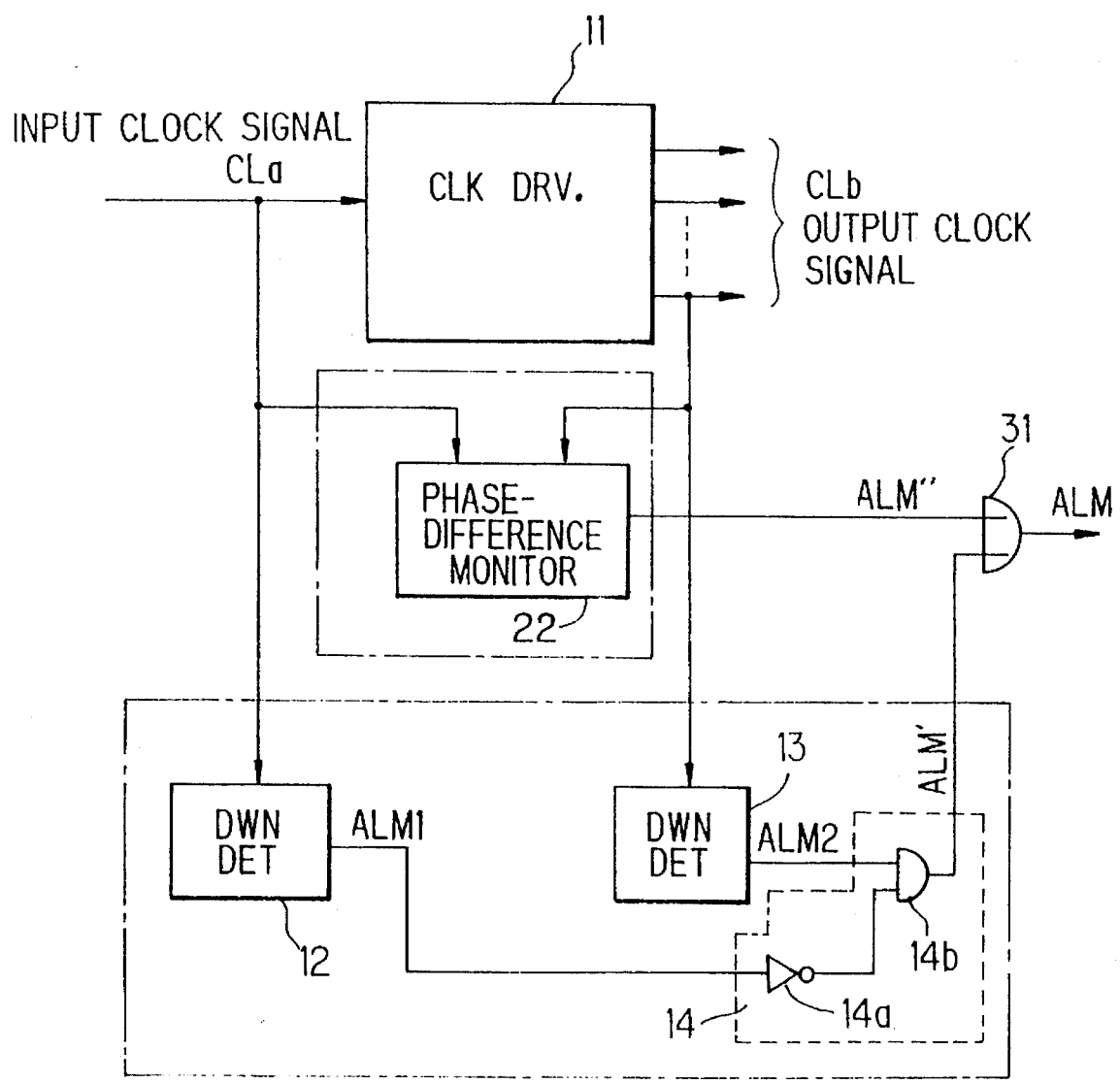
FIG. 8 is a circuit diagram illustrating a fourth embodiment of the present invention.

FIG. 8 is a block diagram illustrating a fourth embodiment of the invention for achieving this. Elements identical with those of the first and second embodiments are designated by like reference numerals. Numeral 11 denotes the clock driver (CLK DRV), 12 the first clock-signal cut-off detector (DWN DET) for detecting cut-off of the input clock signal CLa of the clock driver 11, 13 the second clock-signal cut-off detector (DWN DET) for detecting cut-off of the output clock signal CLb of the clock driver 11, 14 the abnormality discriminating unit for outputting an alarm signal ALM', which indicates that the clock driver 11 is abnormal, in a case where the output clock signal CLb is cut off but not the input clock signal CLa, 22 the phase-difference monitoring unit for comparing a phase difference between the input clock signal CLa and the output clock signal CLb of the clock driver 11, and outputting an alarm signal ALM", which indicates that the clock driver 11 is abnormal, in a case where a phase difference greater than a prescribed value has been detected, and 31 an OR gate for taking the logical sum of the first alarm signal generated by the abnormality discriminating unit 14 and the second alarm signal generated by the phase-difference monitoring unit 22 and outputting the abnormality alarm signal ALM.

Thus, in accordance with the present invention, cut-off of the input clock signal and output clock signal of a clock driver is monitored and an alarm is issued upon discriminating that the clock driver is abnormal in a case where the output clock signal is cut off but not the input clock signal. Alternatively, the phases of the input clock signal and output clock signal of a clock driver are monitored and an alarm is issued upon discriminating that the clock driver is abnormal in a case where the output clock signal has developed a phase shift, in excess of a prescribed value, with respect to the input clock signal. As a result, abnormality in a clock driver circuit, which occupies an important position in an electronic apparatus, can be monitored with ease and the reliability of the apparatus can be improved.

Further, the apparatus for monitoring abnormality in a clock driver according to the present invention is capable of being incorporated in a single-chip IC or the like along with the clock driver circuit. This contributes to an economical and highly reliable clock driver.

As many apparently widely different embodiments of the present invention can be made without departing from the spirit and scope thereof, it is to be understood that the invention is not limited to the specific embodiments thereof except as defined in the appended claims.

What is claimed is:

1. An apparatus for monitoring abnormality of a clock driver in combination with an electronic apparatus having a clock supply unit that supplies a clock signal and a plurality of function executing units to which the clock signal is inputted for executing prescribed functions at an identical clock, wherein each function executing unit is provided with a clock driver which, on the basis of the clock signal, oscillates internally to reproduce a clock signal, each function executing unit comprising:

a frequency divider for dividing the frequency of the clock signal outputted by the clock driver; and a phase-difference monitoring unit for comparing a phase difference between the clock signal inputted from said clock supply unit and the signal outputted by said frequency divider with a prescribed value and outputting an alarm signal which is indicative of an abnormality in the clock driver, in a case where a phase difference greater than the prescribed value has been detected, wherein said clock supply unit outputs a clock signal having a frequency lower than the desired frequency, said clock driver reproduces a clock signal having a high frequency which is equal to the desired frequency based upon the clock signal having the low frequency, said frequency divider divides the frequency of the clock signal outputted by the clock driver and said phase-difference monitoring unit monitors a phase difference between the clock signal inputted from said clock supply unit and the signal outputted by said frequency divider.

* * * * *